(12) United States Patent
Takemae

(10) Patent No.: US 8,836,380 B2
(45) Date of Patent: Sep. 16, 2014

(54) BOOTSTRAP CIRCUIT

(71) Applicant: Transphorm Japan, Inc., Yokohama (JP)

(72) Inventor: Yoshihiro Takemae, Minato (JP)

(73) Assignee: Transphorm Japan, Inc., Yokohama (JP)

( * ) Notice: Subject to any disclaimer, the term of this patent is extended or adjusted under 35 U.S.C. 154(b) by 0 days.

(21) Appl. No.: 13/780,956

(22) Filed: Feb. 28, 2013

(65) Prior Publication Data

US 2013/0249605 A1    Sep. 26, 2013

(30) Foreign Application Priority Data

Mar. 22, 2012  (JP) ................................. 2012-066382

(51) Int. Cl.
*H03K 3/00* (2006.01)
*H03K 17/08* (2006.01)

(52) U.S. Cl.
CPC ..................................... *H03K 17/08* (2013.01)
USPC ............................. 327/108; 327/589; 326/88

(58) Field of Classification Search
USPC ........... 327/108–112, 589; 326/82, 83, 86–88
See application file for complete search history.

(56) References Cited

U.S. PATENT DOCUMENTS

| 5,253,204 | A | * | 10/1993 | Hatakeyama et al. | ... 365/189.06 |
| 5,512,845 | A | * | 4/1996 | Yuh | .................................. 326/88 |
| 5,929,686 | A | * | 7/1999 | Itou | ................................ 327/321 |
| 8,218,392 | B2 | | 7/2012 | Sasaki | |
| 8,269,547 | B2 | * | 9/2012 | Nonaka | .......................... 327/390 |

FOREIGN PATENT DOCUMENTS

| JP | 2011-044186 A | 3/2011 |
| JP | 2011-049741 A | 3/2011 |

\* cited by examiner

*Primary Examiner* — William Hernandez
(74) *Attorney, Agent, or Firm* — Fish & Richardson P.C.

(57) ABSTRACT

A semiconductor device, includes: a first field effect transistor having one terminal to which a first electrical potential is given; a second field effect transistor having one terminal to which a second electrical potential smaller than the first electrical potential is given; a controller that controls each electrical potential of each control terminal of the first field effect transistor and the second field effect transistor; a capacitor element having one end connected to the control terminal of the first field effect transistor, the capacitor element being charged by the control of the controller; and a load element connected between another terminal of the first field effect transistor and another terminal of the second field effect transistor.

6 Claims, 8 Drawing Sheets

US 8,836,380 B2

BOOTSTRAP CIRCUIT

CROSS-REFERENCE TO RELATED APPLICATION

This application is based upon and claims the benefit of priority of the prior Japanese Patent Application No. 2012-066382, filed on Mar. 22, 2012, the entire contents of which are incorporated herein by reference.

FIELD

A certain aspect of the embodiments discussed herein is related to a semiconductor device.

BACKGROUND

A group III nitride semiconductor such as gallium nitride (GaN) has advantages of high withstand voltage, high-speed operation, high thermal resistance and low ON-resistance, as compared with the other types of semiconductors such as Silicon, and hence it is expected that the group III nitride semiconductor is used for a power device. For example, Japanese Laid-Open Patent Publication No. 2011-49741 discloses a driving circuit that drives a GaN field effect transistor (FET) provided as a power semiconductor element.

Also, Japanese Laid-Open Patent Publication No. 2011-44186 discloses a word line driving circuit of a memory cell that includes a capacitor coupling a gate voltage of a FET with a source voltage thereof. A bootstrap circuit driving a signal indicative of a high voltage can be formed by providing a capacitive element such as the above-mentioned capacitor between a gate terminal of a GaN-FET and a source terminal thereof.

SUMMARY

According to an aspect of the present invention, there is provided a semiconductor device, including: a first field effect transistor having one terminal to which a first electrical potential is given; a second field effect transistor having one terminal to which a second electrical potential smaller than the first electrical potential is given; a controller that controls each electrical potential of each control terminal of the first field effect transistor and the second field effect transistor; a capacitor element having one end connected to the control terminal of the first field effect transistor, the capacitor element being charged by the control of the controller; and a load element connected between another terminal of the first field effect transistor and another terminal of the second field effect transistor.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
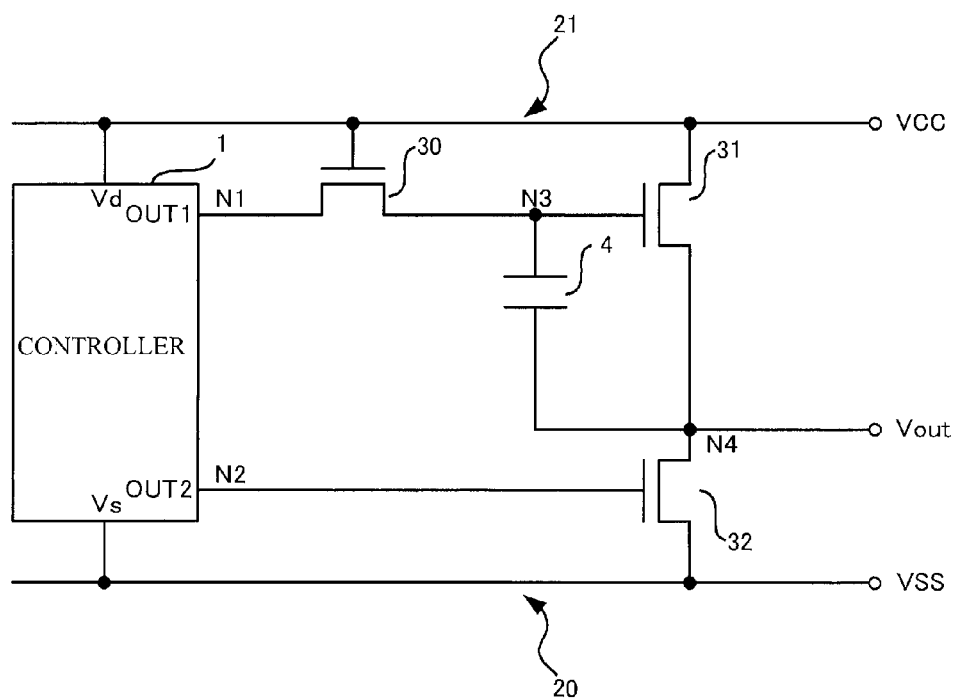
FIG. 1 is a circuit diagram of a semiconductor device according to a comparative example.

FIG. 1 is a circuit diagram of a semiconductor device according to a comparative example. The semiconductor device includes a controller 1, a transistor for gate control 30, a high-voltage side transistor 31, a low-voltage side transistor 32 and a capacitor element 4, and functions as a bootstrap circuit, for example.

An electrical power is supplied to the semiconductor device from an external power supply device via wirings 20 and 21. An electrical potential VCC is given to the wiring 21, and an electrical potential VSS lower than the electrical potential VCC is given to the wiring 20. The electrical potential VCC is higher than the electrical potential VSS, and is 10 volts, for example. On the other hand, the electrical potential VSS is a ground potential, and is 0 volt, for example.

The controller 1 is a voltage control circuit that generates a voltage signal based given timing, and outputs the generated voltage signal. The electrical potential VCC is given to a power terminal Vd from the wiring 21, and the electrical potential VSS is given to a ground terminal Vs from the wiring 20, so that the controller 1 operates. The controller 1 outputs voltage signals having given patterns from output terminals OUT1 and OUT2, respectively. The semiconductor device generates an output signal Vout based on the voltage signals. Here, it is assumed that the vicinities of the output terminals OUT1 and OUT2 are nodes N1 and N2.

Each of the transistor for gate control 30, the high-voltage side transistor 31 and the low-voltage side transistor 32 is a field effect transistor (FET) including a GaN semiconductor. Since the GaN semiconductor arises from specific composition and cannot use a P-type semiconductor substantially, a FET of an N-channel is selected as each of the transistors 30 and 31. Thus, the semiconductor device can drive a high voltage signal by using a GaN FET, as compared with other MOS-FET. The transistors 30 to 32 are enhancement type.

A drain terminal of the transistor for gate control 30 is connected to the output terminal OUT1 of the controller 1, and a source terminal of the transistor for gate control 30 is connected to a gate terminal of the high-voltage side transistor 31. A gate terminal of the transistor for gate control 30 is connected to the wiring 21, and the electrical potential VCC is given to the gate terminal of the transistor for gate control 30. Here, it is assumed that a connection point between one end of the capacitor element 4, and a wiring which couples the source terminal of the transistor for gate control 30 and a gate terminal of the high-voltage side transistor 31 is a node N3.

A drain terminal of the high-voltage side transistor 31 is connected to the wiring 21, and the electrical potential VCC is given to a drain terminal of the high-voltage side transistor 31. A source terminal of the high-voltage side transistor 31 is connected to a drain terminal of the low-voltage side transistor 32. Here, it is assumed that a connection point between another end of the capacitor element 4, and a wiring which couples the source terminal of the high-voltage side transistor 31 and the drain terminal of the low-voltage side transistor 32 is a node N4. The node N4 is connected to an output end of the output voltage Vout of the bootstrap circuit.

The low-voltage side transistor 32 is connected to the wiring 20, and the electrical potential VSS is given to a source terminal of the low-voltage side transistor 32. A gate terminal of the low-voltage side transistor 32 is connected to another output terminal OUT2 of the controller 1. By the above-mentioned connection configuration, the controller 1 controls an electrical potential of each gate terminal (i.e., control terminal) of the high-voltage side transistor 31 and the low-voltage side transistor 32.

The one end of the capacitor element 4 is connected to the gate terminal of the high-voltage side transistor 31, and the another end of the capacitor element 4 is connected to the drain terminal of the low-voltage side transistor 32. Therefore, the controller 1 controls the electrical potential of each gate terminal of the high-voltage side transistor 31 and the low-voltage side transistor 32 so that the high-voltage side transistor 31 and the low-voltage side transistor 32 are in ON states. Hereby, the capacitor element 4 is charged. That is, the capacitor element 4 is charged by the control of the controller 1. The capacitor element 4 may be other capacitive element, such as a parasitic capacity or a wiring capacity between the gate terminal and the source terminal of the high-voltage side transistor 31.

Figure 2:
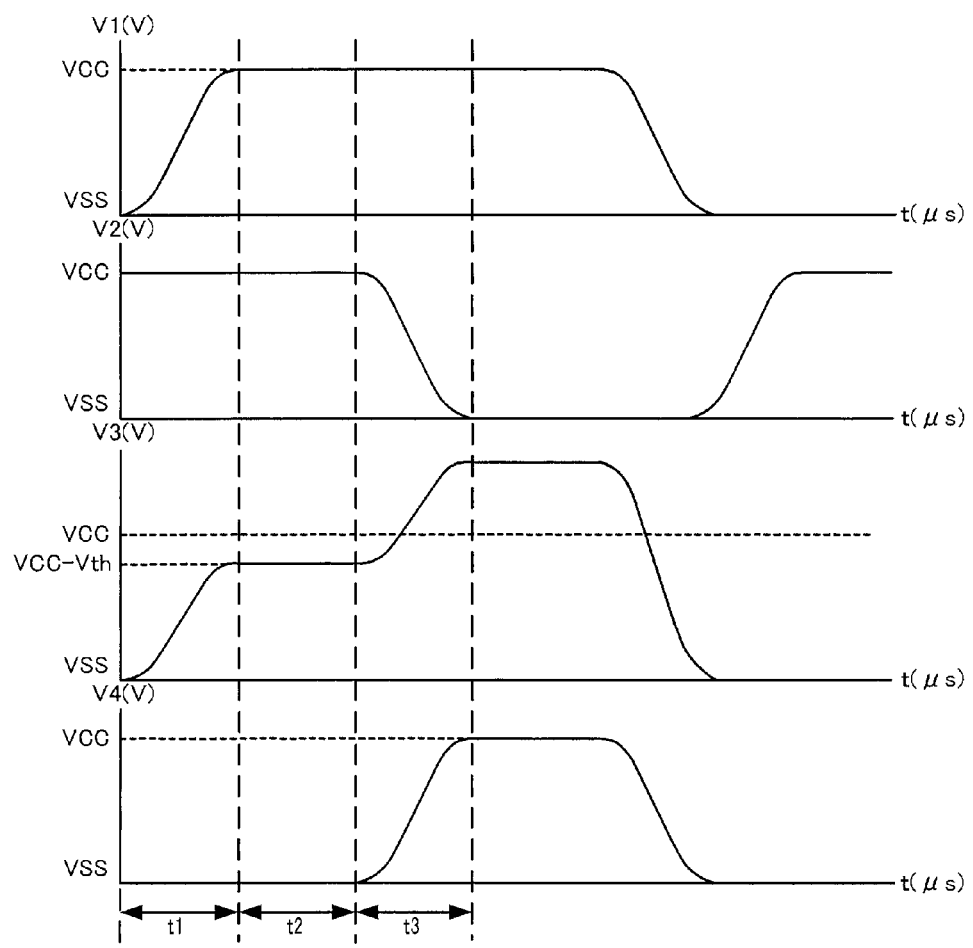
FIG. 2 is a timing chart illustrating the operation of the semiconductor device according to the comparative example.

FIG. 2 is a timing chart illustrating the operation of the semiconductor device according to the comparative example. In each graph of FIG. 2, a horizontal axis indicates a time axis. On the other hand, vertical axes V1 to V4 indicate electrical potentials on the nodes N1 to N4, respectively. Here, the electrical potential V1 on the node N1 corresponds to a voltage value of the voltage signal which the controller 1 outputs from the output terminal OUT1. On the other hand, the electrical potential V2 on the node N2 corresponds to a voltage value of the voltage signal which the controller 1 outputs from the output terminal OUT2.

During a period t1, the electrical potential V1 rises from the electrical potential VSS to the electrical potential VCC by the controller 1. In this case, since the electrical potential of the gate terminal of the transistor for gate control 30 is the electrical potential VCC and the electrical potential of the source terminal of the transistor for gate control 30 is lower than the electrical potential VCC, the transistor for gate control 30 is in the ON state.

On the other hand, since the electrical potential V2 is maintained at the electrical potential VCC by the controller 1, the electrical potential of the gate terminal of the low-voltage side transistor 32 is the electrical potential VCC. In this case, since the electrical potential of the source terminal of the low-voltage side transistor 32 is the electrical potential VSS, the low-voltage side transistor 32 in the ON state and the electrical potential V4 is maintained at the electrical potential VSS.

Therefore, with the rise of the electrical potential V1, the capacitor element 4 is charged, and the potential V3 rises from the electrical potential VSS to an electrical potential VCC-Vth. Here, the electrical potential VCC-Vth is a threshold voltage of the transistor for gate control 30. Thereby, the electrical potential of the gate terminal of the high-voltage side transistor 31 is the electrical potential VCC-Vth and the electrical potential of the source terminal thereof is the electrical potential VSS, so that the high-voltage side transistor 31 is in the ON state.

During a period t2, the voltage VCC-Vth is applied between the gate terminal and the source terminal (hereinafter referred to as "between the gate and the source") of the high-voltage side transistor 31 by the charged capacitor element 4. At this time, when the voltage VCC-Vth is larger than a withstand voltage value between the gate and the source of the high-voltage side transistor 31, the high-voltage side transistor 31 is broken down. For example, when the withstand voltage of the GaN-FET is about 6 volts and the voltages VCC and VCC-Vth are 10 volts and 1 volt, respectively, a voltage of 9 volts is applied between the gate and the source of the GaN-FET, so that the problem described above occurs.

This problem results from each of the high-voltage side transistor 31 and the low-voltage side transistor 32 being an N-channel FET. That is, both of the high-voltage side transistor 31 and the low-voltage side transistor 32 are in the ON states during the period t2, so that a voltage exceeding the withstand voltage value is applied between the gate and the source of the high-voltage side transistor 31. On the other hand, since the bootstrap circuit is not needed in the case of a CMOS (Complementary Metal-Oxide Semiconductor), the same problem does not occur.

During a period t3 of FIG. 2, the electrical potential V2 is controlled so as to be the electrical potential VSS by the controller 1, so that the low-voltage side transistor 32 is in an OFF state. Therefore, the electrical potential V4 rises by the high-voltage side transistor 31 of the ON state, and becomes the electrical potential VCC. At this time, the output voltage Vout also rises likewise. With the rise of the electrical potential V4, the electrical potential V3 rises and becomes an electrical potential exceeding the electrical potential VCC by the voltage VCC-Vth of the charged capacitor element 4. Even if a voltage which exceeds the withstand voltage between the gate and the source of the high-voltage side transistor 31 is applied by the rise of the electrical potential V3, a current flows from the gate terminal to the source terminal, and hence a problem does not occur.

The above-mentioned rise of the electrical potential V3 may be controlled by a parasitic capacity value CN3 of the node N3. When it is assumed that a capacity value of the capacitor element 4 is C1, the electrical potential V3 risen in the period t3 is acquired from a calculating formula "VCC×{C1/(C1+CN3)}". Here, since the parasitic capacity value CN3 of the node N3 is uniquely determined by the high-voltage side transistor 31, it is possible to control the rise of the electrical potential V3 to a nonproblematic extent by setting suitably the capacity value C1 of the capacitor element 4. After the elapse of the period t3, the electrical potentials V1 and V2 are controlled so as to be the electrical potentials VSS and VSS, respectively. The electrical potential V4 becomes the electrical potential VSS from the electrical potentials VCC.

As described above, according to the semiconductor device of the comparative example, the high voltage is applied between the gate and the source of the high-voltage side transistor 31 during the period t2 of FIG. 2. A first embodiment as described below improves this point.

Figure 3:
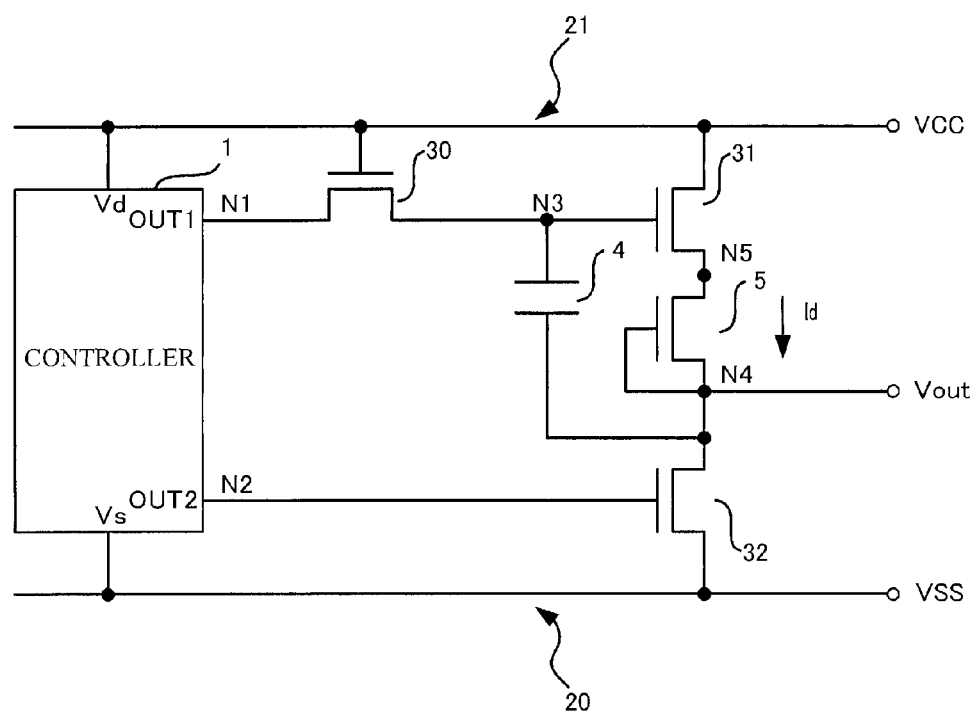
FIG. 3 is a circuit diagram of the semiconductor device according to a first embodiment.

FIG. 3 is a circuit diagram of the semiconductor device according to the first embodiment. In FIG. 3, component elements corresponding to those in FIG. 1 described above are designated by the same reference numerals, and description of these component elements is omitted.

In the semiconductor device according to the first embodiment, a load transistor 5 is provided between the source terminal of the high-voltage side transistor 31 and the drain terminal of the low-voltage side transistor 32 so that an applied voltage between the gate and the source of the high-voltage side transistor 31 is reduced. Here, it is assumed that a connection point between the drain terminal of the load transistor 5 and the source terminal of the high-voltage side transistor 31 is a node N5.

The load transistor 5 is a depletion-type field effect transistor in which a gate terminal and a source terminal are connected to each other. Therefore, even when the voltage between the gate and the source is "0", the load transistor 5 can flow a drain current. Here, the load transistor 5 is a FET including a GaN semiconductor.

Figure 4:
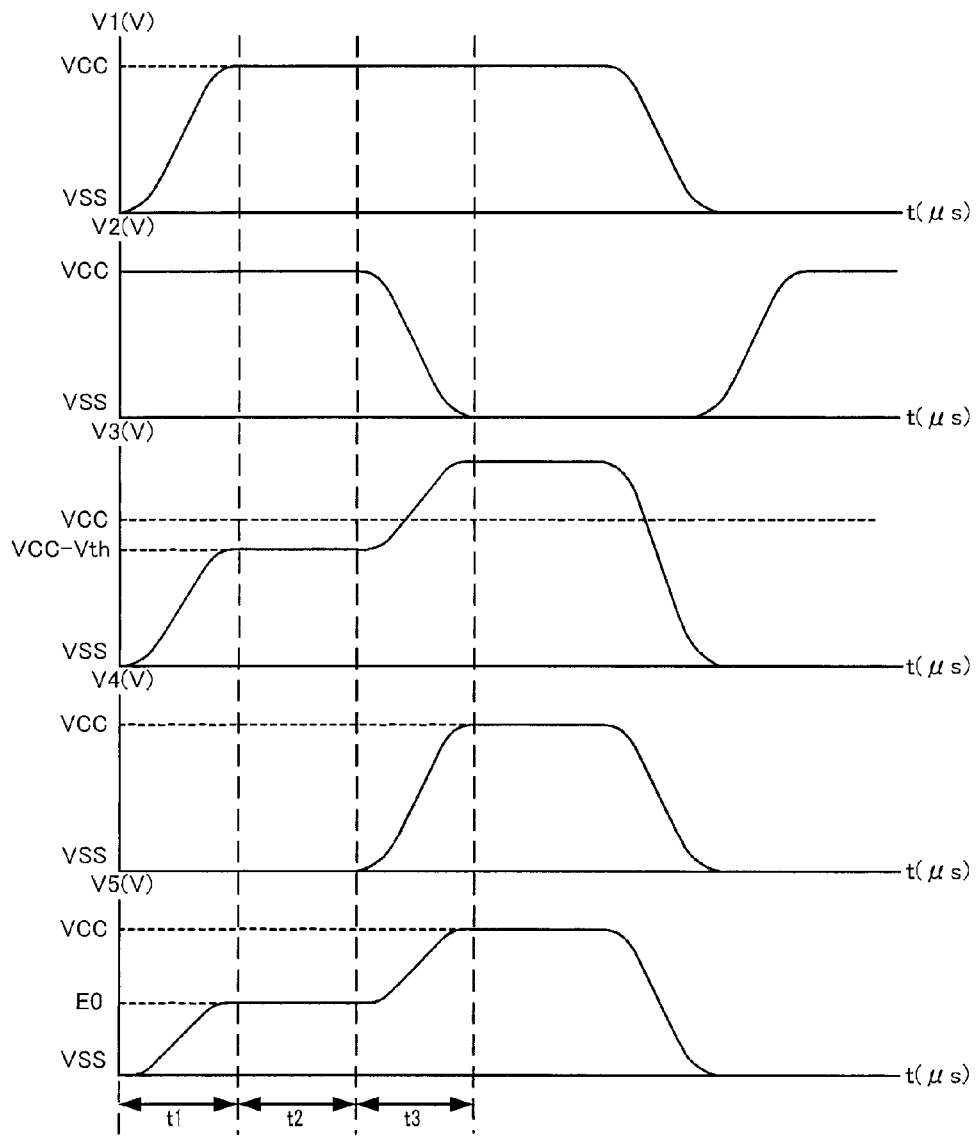
FIG. 4 is a timing chart illustrating the operation of the semiconductor device according to the first embodiment.

FIG. 4 is a timing chart illustrating the operation of the semiconductor device according to the first embodiment. In FIG. 4, an electrical potential V5 of the node N5 in FIG. 3 is illustrated in addition to the contents already illustrated by FIG. 2.

During the period t1, with the rise of the electrical potential V1, the node N5 is charged by the drain current of the load transistor 5 and the electrical potential V5 rises.

Since both of the high-voltage side transistor 31 and the low-voltage side transistor 32 are in the ON states during the period t2, as described above, a through current flows between the transistors 31 and 32. At this time, the drain current also flows to the load transistor 5 connected between the transistors 31 and 32. Therefore, the load transistor 5 generates a constant voltage E0 between the drain and the source, and the electrical potential V5 becomes the voltage E0. That is, a voltage generated between the wiring 20 (Vss) and the wiring 21 (Vcc) by the through current is divided by the load transistor 5.

Thus, since the electrical potential E0 is generated at the node N5, the electrical potential of the source terminal of the high-voltage side transistor 31 rises during the period t2. At this time, the electrical potential VCC-Vth is given to the gate terminal of the high-voltage side transistor 31 as is the case with the comparative example, so that the voltage between the gate and the source of the high-voltage side transistor 31 is reduced. Therefore, the electrical potential E0 is adjusted so that the voltage between the gate and the source is smaller than the withstand voltage value between the gate and the source, and hence the breakdown of the high-voltage side transistor 31 is prevented. Here, since the low-voltage side transistor 32 is in the OFF state during the period t3, the electrical potential V5 rises and becomes the electrical potential VCC.

In the first embodiment, the load transistor 5 may be an enhancement-type FET in which a drain terminal and a gate terminal are connected to each other. However, in this case, the electrical potential V4 is smaller than the electrical potential VCC by a threshold voltage of the load transistor 5 after the period t3.

Also in the embodiment, other load element may be provided as substitute for the load transistor 5. Since a resistance element can also generate a constant voltage, for example, the same effects as described above can be obtained. In the following description, the respective advantages of the resistance element and the FET are described by comparing the resistance element and the FET with each other.

Figure 5:
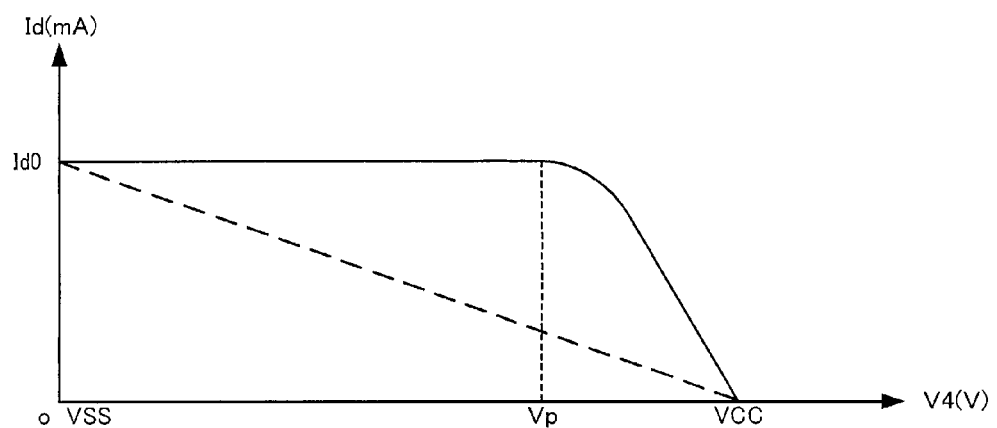
FIG. 5 is a graph illustrating a voltage-current characteristic in a node N4 of FIG. 3.

FIG. 5 is a graph illustrating a voltage-current characteristic in the node N4 of FIG. 3. In FIG. 5, a solid line indicates a characteristic of the FET (i.e., the load transistor 5). On the other hand, a dotted line indicates a characteristic of the resistance element. Also, FIG. 5 illustrates a process in which the electrical potential V4 rises from the electrical potential VSS to the electrical potential VCC and the node N4 is charged, during the period t3 of FIG. 4. Here, it is assumed that an initial value of a through current Id at this time is "Id0".

When the resistance element is adopted as the load element, the through current Id linearly reduces from "Id0" to "0" based on an Ohm's law. On the contrary, when the FET is adopted, the constant through current Id0 flows substantively until the electrical potential V4 reaches a pinch-off voltage Vp of the FET. Therefore, the charge time of the node N4 during the period t3 in the case where the FET is used is shorter than the charge time in the case where the resistance element is used. It is therefore more desirable to use the FET when the function of the bootstrap circuit which controls the output voltage Vout (i.e., electrical potential V4) based on given timing is taken into consideration. On the contrary, it is more desirable to use the resistance element when the manufacturing cost is taken into consideration.

Figure 6:
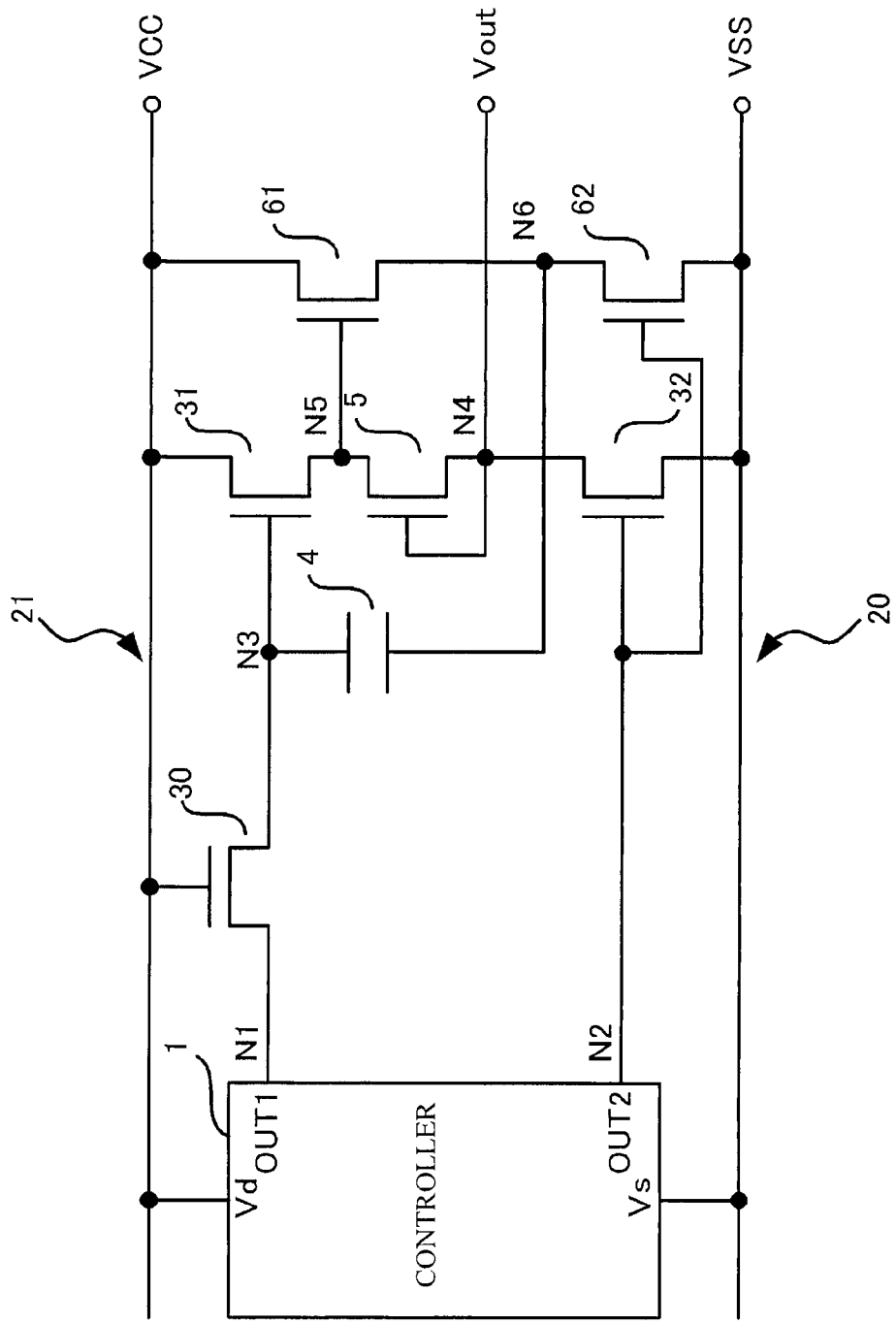
FIG. 6 is a circuit diagram of the semiconductor device according to a second embodiment.

In the above-mentioned first embodiment, the capacitor element 4 is driven with the high-voltage side transistor 31 and the low-voltage side transistor 32, but a driving method of the capacitor element 4 is not limited to this. FIG. 6 is a circuit diagram of the semiconductor device according to a second embodiment. In FIG. 6, component elements corresponding to those in FIG. 3 described above are designated by the same reference numerals, and description of these component elements is omitted.

The semiconductor device according to the second embodiment further includes a high-voltage side driving transistor 61 and a low-voltage side driving transistor 62 which drive the capacitor element 4.

Each of the high-voltage side driving transistor 61 and the low-voltage side driving transistor 62 is a FET including a GaN semiconductor, for example. The electrical potential VCC is given to a drain terminal of the high-voltage side driving transistor 61 via the wiring 21. Moreover, the gate terminal of the high-voltage side driving transistor 61 is connected to the node N5, i.e., a contact point between the high-voltage side transistor 31 and the load transistor 5.

On the other hand, a drain terminal of the low-voltage side driving transistor 62 is connected to a source terminal of the high-voltage side driving transistor 61. The electrical potential VSS is given to a source terminal of the low-voltage side driving transistor 62 via the wiring 20. The gate terminal of the low-voltage side driving transistor 62 is connected to the output terminal OUT2 of the controller 1. By the above-mentioned connection configuration, the controller 1 controls an electrical potential of each gate terminal (i.e., control terminal) of the high-voltage side driving transistor 61 and the low-voltage side driving transistor 62 in addition to the transistors 31 and 32.

One end of the capacitor element 4 is connected to the gate terminal of the high-voltage side transistor 31, and another end of the capacitor element 4 is connected to the drain terminal of the low-voltage side driving transistor 62. Therefore, the capacitor element 4 is driven by the high-voltage side driving transistor 61 and the low-voltage side driving transistor 62. Here, it is assumed that a connection point between the another end of the capacitor element 4 and a wiring which couples the source terminal of the high-voltage side driving transistor 61 and the drain terminal of the low-voltage side driving transistor 62 is a node N6.

Figure 7:
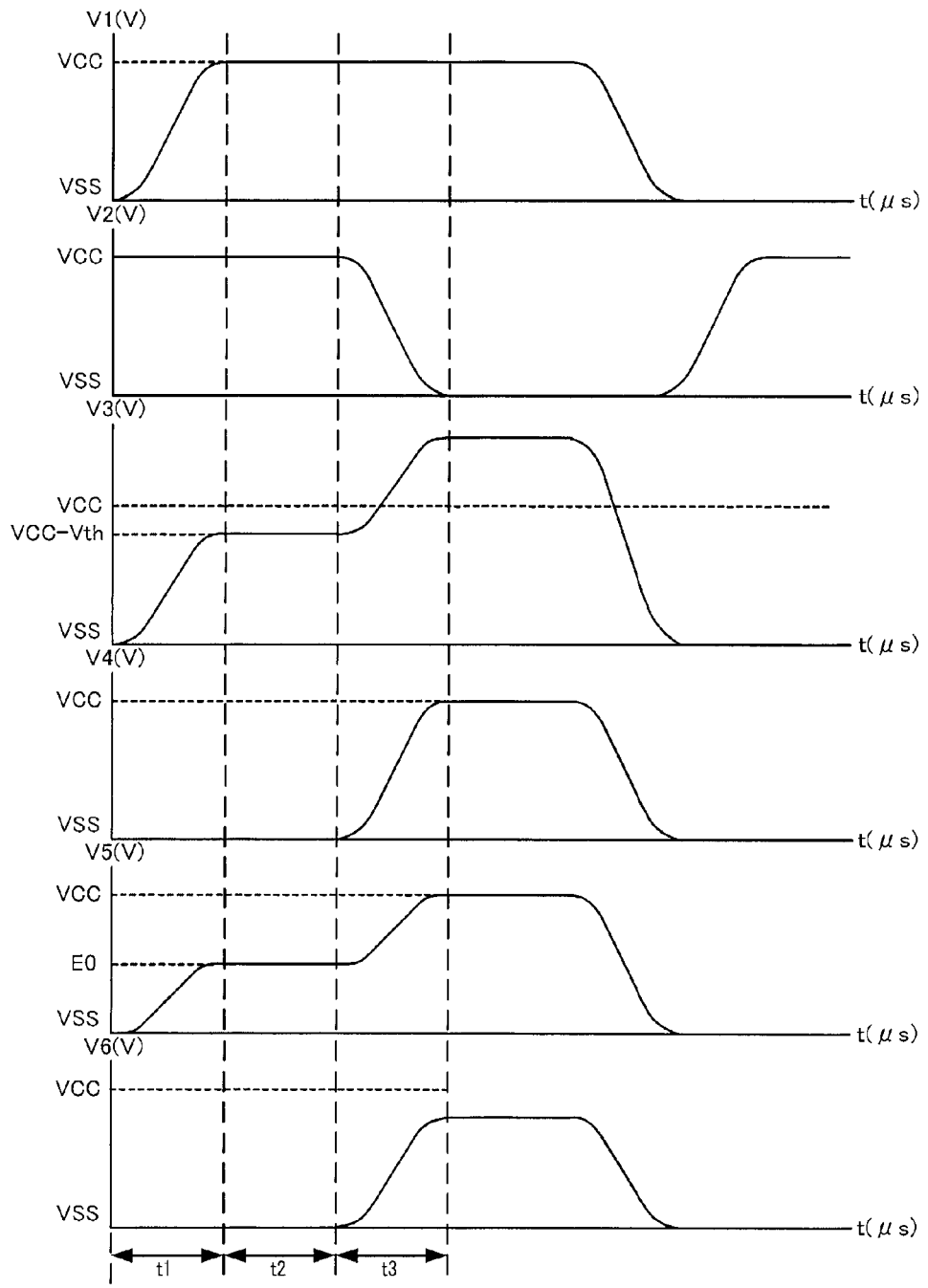
FIG. 7 is a timing chart illustrating the operation of the semiconductor device according to the second embodiment.

FIG. 7 is a timing chart illustrating the operation of the semiconductor device according to the second embodiment. In FIG. 7, an electrical potential V6 of the node N6 in FIG. 6 is illustrated in addition to the contents already illustrated by FIG. 4.

Since the electrical potential V2 is the electrical potential VCC during the period t1, the low-voltage side driving transistor 62 is in the ON state. Zone Name: a1,AMD Next, since the electrical potential V5 is the electrical potential E0 during the period t2, both of the high-voltage side driving transistor 61 and the low-voltage side driving transistor 62 are in the ON states. Thereby, the capacitor element 4 is charged by a current on the node N6 which is amplified with the transistors 61 and 62, and hence the electrical potential V3 rises.

Thus, the capacitor element 4 is driven with the transistors 61 and 62, so that a load on the node N4 reduces. Therefore, the drain current of the transistors 31, 32, and 5 in a preceding step can be set up small, so that the through current of the transistors 31, 32, and 5 during the period t2 can be reduced. Here, since the electrical potential V2 becomes the electrical potential VSS during the period t3, the transistor 62 is in the OFF state and the electrical potential V6 rises.

Figure 8:
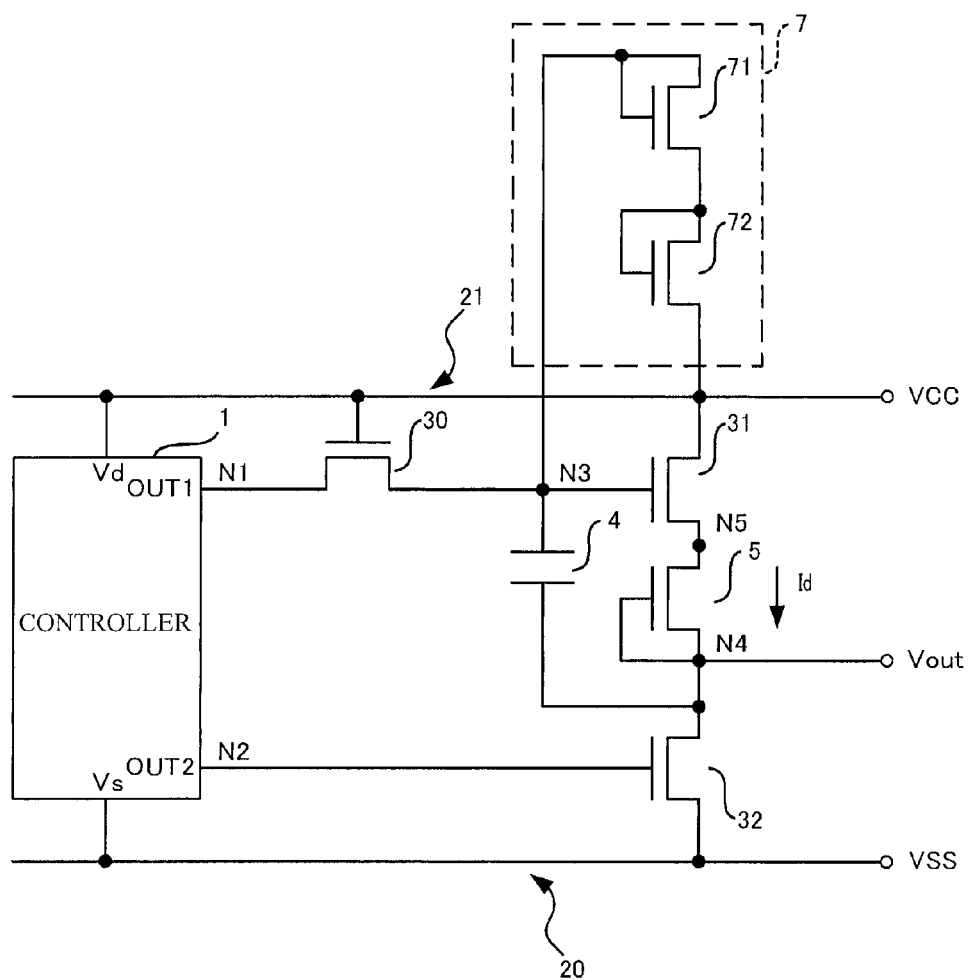
FIG. 8 is a circuit diagram of the semiconductor device according to a third embodiment.

FIG. 8 is a circuit diagram of the semiconductor device according to a third embodiment. In FIG. 8, component elements corresponding to those in FIG. 3 described above are designated by the same reference numerals, and description of these component elements is omitted.

The semiconductor device according to the third embodiment adds a control circuit 7 to the semiconductor device according to the first embodiment. The control circuit 7 includes plural control transistors 71 and 72 that are connected in series with each other, and performs control for inhibiting the rise of the electrical potential V3 during the period t3 in the above-mentioned timing chart. Here, FIG. 8 illustrates two control transistors 71 and 72, but the number of transistors may be determined depending on the controlled variable of the electrical potential V3.

Each of the control transistors 71 and 72 is a FET made of a GaN semiconductor and is an enhancement type. In each of the control transistors 71 and 72, a gate terminal is connected to a drain terminal. A source terminal of the control transistors 71 and a drain terminal of the control transistors 72 are connected to each other. The drain terminal of the control transistors 71 is connected to the node N3, and a source terminal of the control transistors 72 is connected to the wiring 21.

After the period t3 in the timing chart, the control for inhibiting the rise of the electrical potential V3 is performed using at least one of the control transistors 71 and 72, so that it is possible to prevent the voltage exceeding the withstand voltage between the gate and the source of the high-voltage side transistor 31 from being applied therebetween.

As described above, the controller 1 controls the electrical potential of the gate terminal of each of the transistors 30 to 32, 61, 62, 71 and 72, so that the semiconductor device charges the capacitor element 4. Then, when both of the transistors 31 and 32 are in the ON states, the load transistor 5 provided between the transistors 31 and 32 generates the constant voltage E0 by the through current, so that the electrical potential of the source terminal of the high-voltage side transistor 31 rises. Therefore, the voltage between the gate and the source of the high-voltage side transistor 31 which is generated by the charged capacitor element 4 is reduced.

Here, in the above-mentioned embodiments, each of the transistors 5, 30 to 32, 61, 62, 71 and 72 includes the GaN semiconductor, but is not limited to this. Each of the transistors 5, 30 to 32, 61 and 62 may include another semiconductor such as the CMOS. In this case, each of the FETs 5, 30 to 32, 61, 62, 71 and 72 may be any of the types of the P-channel and the N-channel.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various change, substitutions, and alterations could be made hereto without departing from the spirit and scope of the invention.

What is claimed is:

1. A bootstrap circuit, comprising:
    a first field effect transistor having one terminal to which a first electrical potential is given;
    a second field effect transistor having one terminal to which a second electrical potential smaller than the first electrical potential is given;
    a controller that controls each electrical potential of each control terminal of the first field effect transistor and the second field effect transistor;
    a capacitor element having one end connected to the control terminal of the first field effect transistor, the capacitor element being charged by the control of the controller; and
    a load element connected between another terminal of the first field effect transistor and another terminal of the second field effect transistor and
    another end of the capacitor element is connected to the another terminal of the second field effect transistor
    wherein the load element is a depletion-type field effect transistor, a control terminal of the depletion-type field effect transistor being connected to one terminal of the depletion-type field effect transistor.

2. A bootstrap circuit comprising:
    a first field effect transistor having one terminal to which a first electrical potential is given;
    a second field effect transistor having one terminal to which a second electrical potential smaller than the first electrical potential is given;
    a controller that controls each electrical potential of each control terminal of the first field effect transistor and the second field effect transistor;
    a capacitor element having one end connected to the control terminal of the first field effect transistor, the capacitor element being charged by the control of the controller;
    a load element connected between another terminal of the first field effect transistor and another terminal of the second field effect transistor;
    a third field effect transistor having one terminal to which the first electrical potential is given; and
    a fourth field effect transistor having one terminal connected to another terminal of the third field effect transistor, and another terminal to which the second electrical potential is given;
    wherein another end of the capacitor element is connected to the one terminal of the fourth field effect transistor, and
    the controller further controls each electrical potential of each control terminal of the third field effect transistor and the fourth field effect transistor.

3. The bootstrap circuit as claimed in claim 2, wherein each of the third field effect transistor and the fourth field effect transistor includes a GaN semiconductor.

4. The bootstrap circuit as claimed in claim 2, wherein the load element is a depletion-type field effect transistor, a control terminal of the depletion-type field effect transistor being connected to one terminal of the depletion-type field effect transistor.

5. The bootstrap circuit as claimed in claim 2, wherein the load element is a resistance element.

6. The bootstrap circuit as claimed in claim 2, wherein each of the first field effect transistor and the second field effect transistor includes a GaN semiconductor.

\* \* \* \* \*

UNITED STATES PATENT AND TRADEMARK OFFICE
CERTIFICATE OF CORRECTION

PATENT NO. : 8,836,380 B2  Page 1 of 1
APPLICATION NO. : 13/780956
DATED : September 16, 2014
INVENTOR(S) : Yoshihiro Takemae It is certified that error appears in the above-identified patent and that said Letters Patent is hereby corrected as shown below:

In the Claims

Column 8, line 23, in Claim 1: delete "transistor" and insert --transistor,--

Signed and Sealed this
Ninth Day of December, 2014

Michelle K. Lee
*Deputy Director of the United States Patent and Trademark Office*